United States Patent Office 3,458,313
Patented July 29, 1969

3,458,313

HIGH RESOLUTION DEVELOPING OF PHOTOSENSITIVE RESISTS

James E. Webb, Administrator of the National Aeronautics and Space Administration, with respect to an invention of Charles J. Taylor, Catonsville, Md.

No Drawing. Filed Sept. 7, 1966, Ser. No. 577,775
Int. Cl. G03c *1/58, 5/34*
U.S. Cl. 96—49 4 Claims

ABSTRACT OF THE DISCLOSURE

There is disclosed a composition and process for improving the definition of resin masks used in chemical etching. The composition, used for developing organic-solvent-soluble photosensitive etch resists, is comprised of about 50–75% organic solvent with about 25–50% dipropyl carbonate. The process of developing an exposed organic-solvent-soluble photosensitive etch resist includes the step of contacting the image area with the above described developer which results in a developed image that has both improved resolution and a reduced undercut.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

This invention relates to the developing of photosensitive resist resins. More particularly, it relates to a novel composition and the process utilizing the composition for improving the definition of resin masks used in chemical etching.

Photosensitive etch resists are well known in the printing industry as well as in metal decorating, photomilling, and photofabrication applications such as are used to make printed circuits. Recent developments in the photofabrication and photomilling fields require improved compositions and techniques as a result of the trend toward miniaturization, subminiaturization, and finally micro-miniaturization of electronic components and circuits. This trend has resulted in an increased need for precise manufacturing techniques of these components and circuits.

One difficulty in previous processes and compositions is that development of exposed photosensitive resists causes poor resolution and uneven lines. Consequently, it is an object of this invention to provide a product and process whereby this resolution can be improved. In attempting to fulfill this object, I have discovered that the distortion of the photographic image and in particular the lines causing poor resolution is the result of swelling of organic-solvent-soluble photosensitive etch resists during the development process; and that underetching is caused by the reduced adhesion of the developed resist to the substrate caused by the developer. Hence, it is another object of the present invention to prevent swelling of the resist during the development thereof; and a still further object of the present invention is to lessen the reduction of adhesion of the image portion of the resist during developing. Other objects will become apparent from a consideration of the following description and examples.

The photosensitive resists of the prior art can be classified in two broad classes. These are photosensitive resists which are soluble in aqueous solutions and those which are soluble in organic solvents. This invention is only concerned with organic-solvent soluble photosensitive etch resists.

The photosensitive resists which are soluble in organic solvents may be of the natural rubber type; that is, those vulcanized by sulphur or those of the synthetic rubber type. The suitable synthetic rubbers include polymers and copolymers of 1,3-diolefins, such as 1,3-butadiene, isoprene neoprene, and others as well as copolymers containing less than 50% by weight of unsaturated compounds such as isobutylene, styrene and acrylonitrile. These are commercially known as Buna S, Buna N, and Butyl rubbers. The natural and synthetic rubbers listed above are photosensitized by means of an azide, di-azide, or bichromate material and the final resist is a material that is soluble until exposed to light which renders the exposed portion insoluble in the organic solvent. Some examples of the above compositions which are suitable for photosensitive resists are produced by the Eastman Kodak Company under the names KMER (Kodak Metal Etch Resist), KPR (Kodak Photoresist) and KTFR (Kodal Thin Film Resist). Further information pertaining to KPR may be obtained from the teaching of U.S. patents numbered 2,697,039, 2,725,372, 2,732,297, and 2,723,301. Additional information as to the composition of KMER may be obtained from U.S. patents numbered 2,848,328, 2,852,-379, and 2,940,853.

The selection of a particular photosensitive etch resist is primarily based on the characteristics of the materials which include compatibility with the base to be coated by the resist, the solutions or chemicals to be used in the etching process, and the physical qualities of the resist.

Organic solvents which are suitable for use with the above resist materials include trichloroethylene, benzene, toluene, xylene, and Stoddard's solvent. These solvents cause a swelling of the exposed resist during the development process which results in an improper washing between closely adjacent lines of the image and unevenness of the lines in the developed resist. I have now found that by adding from about 25% to 50% of dipropyl carbonate to the developing solvent that this swelling is prevented and adhesion of the resist image to the substrate is improved.

The following examples serve to illustrate the invention:

Example 1

A wafer coated with KMER in a thickness of 1.7 microns (before developing) was exposed to a resolution pattern image having spacings of .0001, .00025, .0005, .001, and .002 inch. The wafer was then spray developed for thirty seconds using KMER developer which is an organic solvent produced by the Eastman Kodak Company and immediately after developing a spray rinse of 80% isopropyl alcohol and 20% KMER thinner was given the wafer for fifteen seconds. The wafer was then blown dry and inspected and found to have a resolution of .0002 inch upon inspection and was under cut $81\times10^{-6}$ inches by a standard fluoride etch on the image area.

Example 2

The procedure of Example 1 was followed using 75% KMER developer and 25% dipropyl carbonate. Upon inspection this wafer had a resolution of .0001 inch.

Example 3

The procedure of Example 1 was followed using 70% KMER developer and 30% dipropyl carbonate. Inspection of this wafer after developing showed a resolution of .0001 inch and an undercut of $65\times10^{-6}$ inches was produced during the etch.

Example 4

The procedure of Example 1 was followed using 60% KMER and 40% dipropyl carbonate. Inspection of this wafer after developing showed a resolution of .0001 inch and an undercut of $56\times10^{-8}$ inches by the etch.

Example 5

The procedure of Example 1 was followed using 50% KMER developer and 50% dipropyl carbonate. Upon inspection this wafer exhibited a resolution of .0001 inch and was undercut $67 \times 10^{-6}$ inches by the etch.

Examples 6

The procedure of Example 1 was followed using 50% Stoddard's solvent and 50% dipropyl carbonate as a developer. While this developer did not significantly improve the resolution undercutting had been reduced to $62 \times 10^{-6}$ inches.

The undercutting which resulted during the etching process was found to be significantly reduced by utilization of from about 25 to about 50% dipropyl carbonate by volume of the developer. This is thought to be a result of the effect of the developer during developing upon adhesion of the resist to the substrate. It will be appreciated, however, that the above described composition and process prevent both swelling and the reduction of adhesion of the resist during developing as well as being operative to improve resolution. Moreover, while the invention has been particularly shown and described in connection with preferred examples thereof, it will be understood by those skilled in the art that various changes in form and details may be made therein without departing from the spirit and scope of the invention.

The embodiments of the invention in which an exclusive property or privilege is claimed are defined as follows:

1. A method of developing an exposed photosensitive etch resist comprising a photosensitive agent from the group consisting of azides, diazides and bichromates and a colloid from the group consisting of natural and synthetic rubbers by contacting the image area with a developer composition comprising by volume about 50% to about 75% of an organic solvent for said resist taken from the group consisting of trichloroethylene, benzene, toluene, xylene and Stoddard's solvent and about 25% to about 50% dipropyl carbonate, thereby improving the resolution of the developed image and reducing undercutting when etched.

2. The method of claim 1 in which about 50% of the composition is an organic solvent and about 50% is dipropyl carbonate.

3. The method of claim 1 in which about 60% of the composition is an organic solvent and about 40% is dipropyl carbonate.

4. The method of claim 1 wherein the organic solvent is Stoddard's solvent.

References Cited

UNITED STATES PATENTS

| | | | |
|---|---|---|---|
| 2,734,041 | 2/1956 | Jones et al. | 106—311 X |
| 2,770,639 | 11/1956 | Slocombe et al. | 260—463 |
| 2,821,539 | 1/1958 | Newman et al. | 106—311 X |
| 3,046,125 | 7/1962 | Wainer | 96—115 X |
| 3,140,270 | 7/1964 | Thoma et al. | 96—35.1 X |
| 3,227,740 | 1/1966 | Fenton | 260—463 |
| 3,295,974 | 1/1967 | Erdmann | 96—36.3 X |
| 3,376,139 | 4/1968 | Giangualano et al. | 96—35.1 |
| 3,382,181 | 5/1968 | Oberdorfer | 252—364 |

GEORGE F. LESMES, Primary Examiner

R. E. MARTIN, Assistant Examiner

U.S. Cl. X.R.

96—48; 106—311; 252—364